United States Patent [19]

Mochiji et al.

[11] Patent Number: 4,960,676
[45] Date of Patent: Oct. 2, 1990

[54] METHOD FOR FORMING PATTERN BY USING GRAFT COPOLYMERIZATION

[75] Inventors: Kozo Mochiji, Hachioji; Hiroaki Oizumi, Kokubunji; Yasunari Soda, Koganei; Takeshi Kimura, Higashimurayama, all of Japan

[73] Assignee: Hitachi, Ltd., Tokyo, Japan

[21] Appl. No.: 199,712

[22] Filed: May 27, 1988

[30] Foreign Application Priority Data

May 29, 1987 [JP] Japan .............................. 62-131129
Jul. 10, 1987 [JP] Japan .............................. 62-171145

[51] Int. Cl.$^5$ .............................................. G03C 5/16
[52] U.S. Cl. .................................... 430/326; 430/325; 430/328; 430/967
[58] Field of Search ............... 430/325, 326, 328, 330, 430/967

[56] References Cited

U.S. PATENT DOCUMENTS 4,587,203  5/1986  Brault et al. ..................... 430/325
4,596,761  6/1986  Brault ............................. 430/296
4,657,845  4/1987  Frechet et al. .................... 430/326

OTHER PUBLICATIONS

Gazard et al, Polymer Engineering & Science, Nov. 1980, vol. 20, No. 16, pp. 1069–1072.
Liu et al, "Polymethyl Methacrylate Resist Sensitivity Enhancement in X-Ray Lithography ...", Appl. Phys. Lett., 44(10), May 15, 1984, pp. 973–975.
Tagawa, "Pulse Radiolysis and Laser Photolysis Studies ...", Radiat. Phys. Chem., vol. 27(6), 1986, pp. 455–459.

Primary Examiner—Jose Dees
Attorney, Agent, or Firm—Antonelli, Terry, Stout & Kraus

[57] ABSTRACT

The method for forming a pattern according to the present invention comprises a step of irradiating a resist layer applied on a substrate to be worked with X-ray radiation through a mask in an oxygen-containing atomsphere to expose said resist layer, a step of decomposing a peroxide produced within said exposed resist layer in an atmosphere free from oxygen, a step of introducing a monomer into said atmosphere free from oxygen to conduct graft copolymerization of said resist layer at the exposed portion with said monomer, and a step of developing said resist layer to remove said resist layer at the portion remaining ungrafted.

2 Claims, 2 Drawing Sheets

METHOD FOR FORMING PATTERN BY USING GRAFT COPOLYMERIZATION

BACKGROUND OF THE INVENTION

The present invention relates to lithography in which light or X ray (hereinafter generically referred to as a "radiation") is used and particularly to X ray lithography by using graft copolymerization which advantageously exhibits a high throughput.

Hitherto, the exposure of a resist in lithography by making use of radiation-induced graft copolymerization has been limited to one carried out in vacuo or in an inactive gas, as described in, e.g., Appl. Phys. Lett., 44 (10), 15 May, 1984, p. 973–p. 975, and U.S. Pat. No. 4,195,108. The limitation was made in order to prevent a polymer radical of a resist produced through the exposure from being quenched due to the reaction thereof with an oxygen molecule.

In the above-described prior art, the exposure equipment should purposely be evacuated to produce a vacuum exposure atmosphere or should be provided with some means for replacing the atmosphere with an inactive gas. Further, the above-described control of the atmosphere raised a problem with respect to a lowering in the throughput of the lighography.

SUMMARY OF THE INVENTION

Therefore, an object of the prevent invention is to provide a method for forming a pattern by using graft copolymerization which enables a marked reduction in the time taken for the exposure.

The above-described object can be attained by enabling graft copolymerization of a compound formed in a resist with a monomer through exposure in an oxygen-containing atmosphere, typically in the air.

A polymer used as a resist etc. is oxidized upon being exposed to a radiation in the presence of oxygen to form a peroxide. The peroxide is known to be very unstable and tends to be easily decomposed when heated. The peroxide heated in an atmosphere free from oxygen is immediately decomposed to produce a radical. Therefore, it is possible to conduct graft copolymerization through contact thereof with a monomer simultaneously with or after the heat treatment.

DESCRIPTION OF THE PREFERRED EMBODIMENTS

Example 1

Figure 1A:
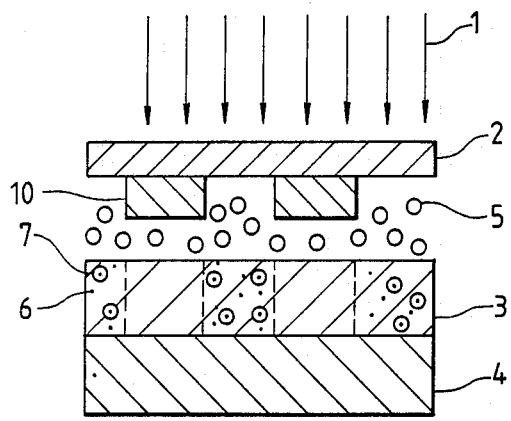
FIGS. 1A to 1C are each a flow diagram illustrating an example of the method for forming a pattern according to the present invention.
Figure 1B:
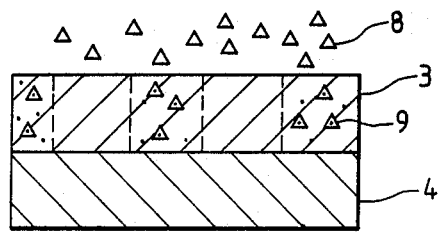
Figure 1C:
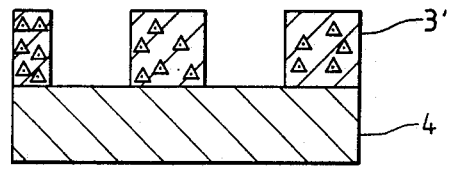
Figure 2A:
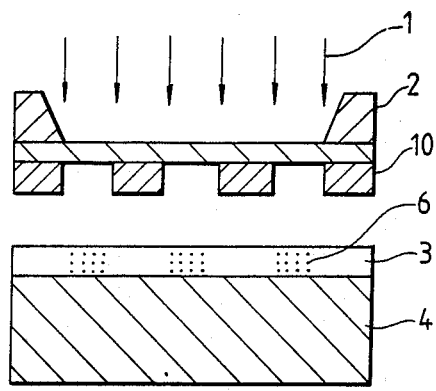
FIGS. 2A to 2E are each a flow diagram illustrating another example of the method for forming a pattern according to the present invention.
Figure 2B:
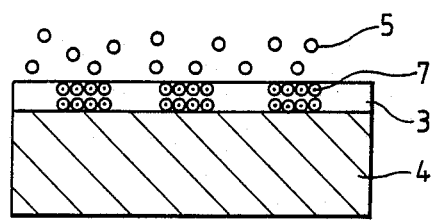
Figure 2C:
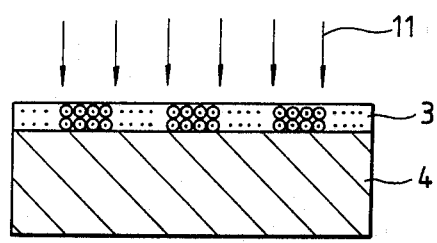
Figure 2D:
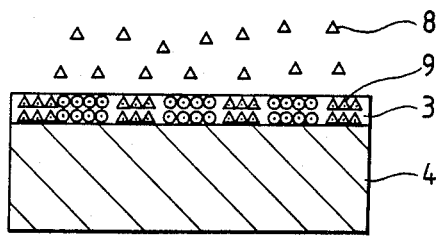
Figure 2E:
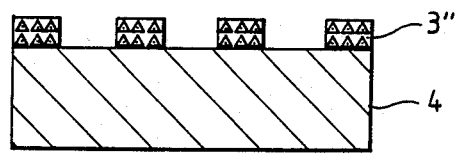

An example of the present invention will now be described with reference to FIGS. 1A to 1C. Poly(phenyl methacrylate) (PPhMA) was applied to a substrate to be worked (4), such as a semiconductor wafer, to form a resist layer (3) having a thickness of 1 $\mu$m, followed by exposure to an X ray (1) in an atmosphere containing oxygen, typically in the air, through an X ray mask (2) having an X ray absorber (10) (exposing process). The X ray (1) was a characteristic line ($\lambda=0.54$ nm) from a Mo cathode, and the exposure dosage was about 10 mJ/cm$^2$. Thus, since the exposure was conducted in the air, a polymer radical (6) produced within the resist layer (3) through exposure to the X ray (1) reacted with an oxygen molecule (5) to form a peroxide (7) (see FIG. 1A). Then, the resist layer (3) was heated at a temperature of 40° to 110° C. in an atmosphere free from oxygen, typically in vacuo, to decompose the peroxide (7) (decomposing process) while an acrylic acid monomer (8) was introduced into the system, thereby forming a graft copolymer (9) in a period of 30 min (graft copolymerization process) (see FIG. 1B). Thereafter, the portion of the resist layer (3) which remained ungrafted was dissolved away with a developer comprising 2-methoxyethyl acetate, thereby forming a negative pattern (3') (development process) (see FIG. 1C). According to this example, the adoption of a simple heat treatment has enabled an X-ray graft reaction in the air by making use of PPhMA having excellent dry etching resistance.

The peroxide (7) may be decomposed by an infrared or radiation-induced chemical reaction.

The decomposing process may be conducted simultaneously with the grafting process.

Further, a positive pattern may be formed by dissolving away, in the development process, the portion of the resist layer which has been graft polymerized. This can be attained by using a properly selected developer.

Moreover, although in the above-described Example 1, poly(phenyl methacrylate) and acrylic acid were used as the resist and the monomer, respectively, the same effect can be attained by using a combination of a polymer which easily generates a radical, e.g., a polymethacrylate or polystyrene, with a graft-polymerizable monomer, e.g., methyl acrylate or methacrylic acid.

Example 2

Another example of the present invention will now be described with reference to FIGS. 2A to 2E. MES-X, manufactured by Japan Synthetic Rubber Co., Ltd., was applied to a substrate to be worked (4) to form a resist layer (3) having a thickness of 1 $\mu$m, followed by exposure to an X ray (1) in an atmosphere containing oxygen, typically in the air, through an X ray mask (2) having an X ray absorber (10) (exposing process). The X ray (1) was a characteristic line ($\lambda=0.54$ nm) from a Mo cathode, and the exposure dosage was about 100 mJ/cm$^2$. Thus, since the exposure is conducted in the air, a polymer radical (6) produced within the resist layer (3) by irradiation with the X ray (1) reacts with an oxygen molecule (5) to form a peroxide (7) (see FIGS. 2A and 2B).

Up to this stage, the same process as that of Example 1 was repeated. Then, the whole surface of the resist layer (3) was exposed to an ultraviolet ray (11), e.g., in vacuo (exposure process) (see FIG. 2C). The ultraviolet ray (11) was a far ultraviolet ray (wavelength: 200 to 300 nm) from a Xe lamp as a light source. The exposure dosage was about 50 mJ/cm$^2$. The exposure of the whole surface of the resist layer (3) to the ultraviolet ray (11) brought about a remarkable decrease in the radical density of the resist layer (3) at the portion containing the peroxide (7) formed therein, i.e., at the portion exposed to the X ray (1). By contrast, the radical density was remarkably increased at the portion free from the peroxide (7), i.e., at the portion unexposed to the X ray (1). Thereafter, an acrylic monomer (8) was introduced into the system in an atmosphere free from oxygen to form a grafted polymer (9) in a period of 30 min at the portion unexposed to the X ray (grafting process) (see FIG. 2D). Then, the portion of the resist layer (3) which remained ungrafted was dissolved away with a developer comprising a mixed solution composed of ethyl cellosolve and cyclohexane, thereby forming a positive pattern (development process) (see FIG. 2E).

The exposure process may be conducted simultaneously with the grafting process.

The exposure process may also be conducted by making use of an electron beam or an X ray.

Further, a negative pattern may be formed by dissolving away, in the development process, the portion of the resist layer which has been graft polymerized. This can be attained by using a properly selected developer. Moreover, a combination of the use of a resist consisting of only an organic compound with the use of a metal-containing organic compound graft-polymerizable with the resist enables the development by etching with an oxygen plasma or the like.

Example 2 has enabled the formation of a positive resist pattern which could not be obtained in the prior art.

Further, since it has become possible to form a positive resist pattern, it is possible to use the mask pattern used in the exposure to the X ray in a conventional reversed pattern, which brings about an effect of increasing the range with respect to the selection of the electron-beam resist used in the manufacture of the mask.

As described above, according to the present invention, the exposure for radiation-induced graft copolymerization can be conducted in the air, which enables not only a marked decrease in the exposure throughput but also simplification of the exposure apparatus.

What is claimed is:

1. A method for forming a pattern which comprises a step of irradiating a resist layer which is capable of forming radicals and peroxides upon being exposed to X-ray radiation and which is applied on a substrate to be worked, with X-ray radiation through a mask in an oxygen-containing atmosphere to expose said resist layer, a step of irradiating the whole surface of said resist layer with an ultraviolet ray radiation in an atmosphere free from oxygen, a step of introducing a monomer into said atmosphere free from oxygen to conduct graft copolymerization of said unexposed layer with said monomer, and a step of developing said resist layer to remove said resist layer at the portion remaining ungrafted.

2. A method for forming a pattern according to claim 1, wherein said step of ultraviolet ray irradiation is conducted simultaneously with said step of graft copolymerization.

* * * * *